United States Patent
Yong et al.

[19]

[11] Patent Number: 5,980,273
[45] Date of Patent: Nov. 9, 1999

[54] COVER FOR AN EDGE MOUNTED PRINTED CIRCUIT BOARD CONNECTOR

[75] Inventors: Chooi Seong Au Yong; Nai Hock Lwee, both of Singapore, Singapore

[73] Assignee: Thomas & Betts International, Inc., Sparks, Nev.

[21] Appl. No.: 08/976,815

[22] Filed: Nov. 24, 1997

Related U.S. Application Data

[63] Continuation-in-part of application No. 08/741,011, Oct. 31, 1996.

[51] Int. Cl.$^6$ ............................................. H01R 9/09
[52] U.S. Cl. .......................... 439/79; 439/328; 439/136
[58] Field of Search ................................ 439/79, 80, 65, 439/59, 136, 328, 325, 377, 946

[56] References Cited

U.S. PATENT DOCUMENTS

| | | |
|---|---|---|
| 3,652,899 | 3/1972 | Henschen . |
| 4,157,785 | 6/1979 | Freliech . |
| 4,193,108 | 3/1980 | Romano . |
| 4,416,496 | 11/1983 | Brefka . |
| 4,695,112 | 9/1987 | Matson et al. . |
| 4,708,415 | 11/1987 | White ........................................ 439/633 |
| 4,712,848 | 12/1987 | Edgley . |
| 4,734,042 | 3/1988 | Martens et al. . |
| 4,968,266 | 11/1990 | Yamamoto .............................. 439/271 |
| 5,096,435 | 3/1992 | Noschese et al. . |
| 5,160,275 | 11/1992 | Nakamura et al. ...................... 439/328 |
| 5,184,961 | 2/1993 | Ramirez et al. . |
| 5,277,611 | 1/1994 | Berek et al. . |
| 5,318,212 | 6/1994 | Becker et al. . |
| 5,419,483 | 5/1995 | Becker et al. . |
| 5,499,162 | 3/1996 | Bartuska et al. ........................ 439/946 |
| 5,647,755 | 7/1997 | Hida et al. . |
| 5,658,154 | 8/1997 | Bumsted et al. .......................... 439/79 |
| 5,689,405 | 11/1997 | Bethurum ................................ 439/328 |
| 5,754,404 | 5/1998 | Biermann et al. ...................... 439/946 |
| 5,823,799 | 10/1998 | Tor et al. ................................. 439/79 |

FOREIGN PATENT DOCUMENTS

| | | |
|---|---|---|
| 0032393 | 8/1996 | Singapore . |
| 0032459 | 8/1996 | Singapore . |
| 0032505 | 8/1996 | Singapore . |
| 0033475 | 10/1996 | Singapore . |
| 0033508 | 10/1996 | Singapore . |
| 0033618 | 10/1996 | Singapore . |

*Primary Examiner*—Paula Bradley
*Assistant Examiner*—Tho Dac Ta
*Attorney, Agent, or Firm*—Hoffmann & Baron, LLP

[57] ABSTRACT

A cover is employed with an edge mount electrical header connector to secure the header connector to a printed circuit board during soldering. The header connector includes plural electrical contacts supported in an insulative housing. The contacts include extending solder tails for engagement with solder pads of the printed circuit board. The cover includes an elongate insulative body for attachment to the header connector. The body of the cover includes gripper arms extending therefrom and being in spaced opposition to the extending solder tails. The solder tails and the gripper arms form a space therebetween for receiving an edge of the printed circuit board. The gripper arms and solder tails retain the printed circuit board edge so as to permit secure soldering of the solder tails to the solder pads of the printed circuit board. The removable cover may be employed over a device bay plug to cover exposed contacts during the soldering process. The device bay plug may then be connected to a device bay receptacle.

5 Claims, 6 Drawing Sheets ated 5,980,273

COVER FOR AN EDGE MOUNTED PRINTED CIRCUIT BOARD CONNECTOR

CROSS REFERENCE TO RELATED APPLICATION

This application is a continuation-in-part of U.S. application Ser. No. 08/741,011, filed Oct. 31, 1996, entitled "COVER FOR AN EDGE MOUNTED PRINTED CIRCUIT BOARD CONNECTOR".

FIELD OF THE INVENTION

The present invention relates generally to an electrical connection assembly adapted for establishing electrical and mechanical engagement to a printed circuit board. More particularly, the present invention relates to a removable cover and an edge mounted printed circuit board connector which permits the secure positioning of the connector to the edge of the printed circuit board so as to permit solder connection of the connector to the printed circuit board.

BACKGROUND OF THE INVENTION

There are a wide variety of electrical connectors which are adapted to be mated with a printed circuit board. Many of these connectors, referred to as header connectors, are supported adjacent an edge of the printed circuit board so as to be accessible for external electrical connection with a mating connector.

These header connectors typically include an insulative housing which supports a plurality of electrical contacts therein. The contacts include tail portions which extend from the housing and are adapted for electrical engagement with electrical traces on the printed circuit board. The solder tails extending from the housing of the header connector are aligned with solder pads of the traces of the printed circuit board so that the solder tails may be ultimately soldered to the solder pads effecting permanent mechanical and electrical engagement between the header connector and the printed circuit board. The solder tails are typically spring biased so as to exert a spring force against the solder pads of the printed circuit board so that effective electrical engagement is established and maintained upon placement of the header connector on the edge of the printed circuit board.

As these header connectors are mounted to an edge of the printed circuit board, the connectors may be subject to tilting or movement during the manufacturing process prior to solder connection of the tails to the pads. Tilting or movement of the connector with respect to the printed circuit board may cause a dislodgement of one or more of the solder tails from the solder pad. Furthermore, warpage of the printed circuit board is often found. Such warpage may result in intermittent contact between the solder pads. Additionally, as the solder tails are typically spring biased to assure engagement with the solder pads, excessive titling, warping or movement may result in loss of resiliency of the spring biased tails.

One technique to overcome such problems is to rigidly clamp the header connector to the printed circuit board prior to soldering so as to prevent movement of the connector with respect to the board. Clamping of the connector to the board often requires use of fastening hardware such as screws which are mounted through the connector and into holes located in the printed circuit board. Use of such securement hardware may interfere with the soldering process rendering such soldering difficult and costly. Furthermore, rigidly clamping the connector to the printed circuit board also results in other problems. For instance, mechanical fastening in this manner may also result in the spring bias of the solder tails losing their resiliency and thereby losing effective electrical engagement with the solder pads of the traces.

In order to alleviate certain of these problems it has been found that an edge mounted header connector may be formed with one or more gripper arms which extend from the insulative housing and underlie the solder tails at one or more locations along the length of the header connector. The gripper arms and the solder tails form a space therebetween which accommodates the edge of the printed circuit board. To a great extent the location of the gripper arms prevents the adverse effects of connector tilting with respect to the printed circuit. Thus the solder tails are maintained in contact with the solder pads during and after the soldering process. A connector having such gripper arms and exhibiting such advantages is shown and described in commonly assigned U.S. patent application entitled "SINGLE-SIDED STRADDLE MOUNT PRINTED CIRCUIT BOARD CONNECTOR", filed Oct. 23, 1996, now U.S. Pat. No. 5,823,799 While the structure shown and described in that application serves adequately for its intended function, the connector itself must be formed to have such gripper arms. This requires forming a specialized connector having the gripper arm feature formed therewith. In certain situations where a header connector is to be employed where the gripper arms do not pre-exist in the connector structure, the features and benefits of such gripper arms cannot be employed. Also as this gripper arm feature is integral with the connector it remains with the connector after soldering. This may not always be a desirable situation.

Further during the soldering process extending portions of the connector could be exposed to contact with solder. This is especially troublesome if the solder comes in contact with the exposed portions of the contacts of the connector designed for connection to a mating connector.

It is therefore desirable to provide an electrical connection assembly which may be mounted to the edge of the printed circuit board and which provides superior resistance to the adverse affects of connector tilting and printed circuit board warpage and which protects expanded contacts from contact with solder during the soldering process.

SUMMARY OF THE INVENTION

It is an object of the present invention to provide an electrical connection assembly which may be mechanically and electrically secured to the edge of a printed circuit board.

It is a further object of the present invention to provide an electrical connection assembly which may be mounted to the edge of a printed circuit board and which overcomes the adverse effects of connector titling and printed circuit board warpage.

It is a still further object of the present invention to provide an edge mounted connection assembly which employs a cover which may be supported over the connector during solder securement of the connector to the edge of a printed circuit board so as to protect exposed portions of the connector during soldering.

In the efficient attainment of these and other objects, the present invention provides a kit of parts adapted to establish mechanical and electrical connection between a printed circuit board and a receptacle connector. The printed circuit board includes a plurality of solder pads along one edge thereof. The kit includes an edge connector having an elongate insulative housing and plural electrical contacts supported in the housing. The contacts have solder tails extending from the housing and are adapted to be supported at the edge of the printed circuit board for solder connection to the solder pads therealong. The contacts further include extending connection extents, plural of the extents being supported on opposed planar surfaces of plural extending housing platforms, the connection extents and the platforms form plural spaced apart engagement arrays adapted for electrical connection to the receptacle connector. The kit further includes a cover adapted for removable attachment to the edge connector. The cover includes an elongate insulative body having plural spaced apart enclosed cavities. Each engagement array of the edge connector is adapted to be accommodated within one of the cavities for individually enclosing each engagement array including the connection extents and the platforms. Upon soldering of the contacts of the edge connector to the printed circuit board, the engagement arrays are protected.

As more particularly shown by way of the preferred embodiment herein, the edge connector includes at each longitudinal end thereof, a hold-down foot, each of which defining a board gripping surface. The cover includes a plurality of gripping arms extending therefrom. Each gripping arm has a gripping arm surface which is in facing spaced opposition to the gripping surface of the hold-down feet. This defines therebetween a space for supporting the edge of a printed circuit board. The printed circuit board is held within the space so as to maintain the solder tails of the connector in engagement with the solder pads of the printed circuit board during soldering.

DETAILED DESCRIPTION OF THE PREFERRED EMBODIMENTS

Figure 1:
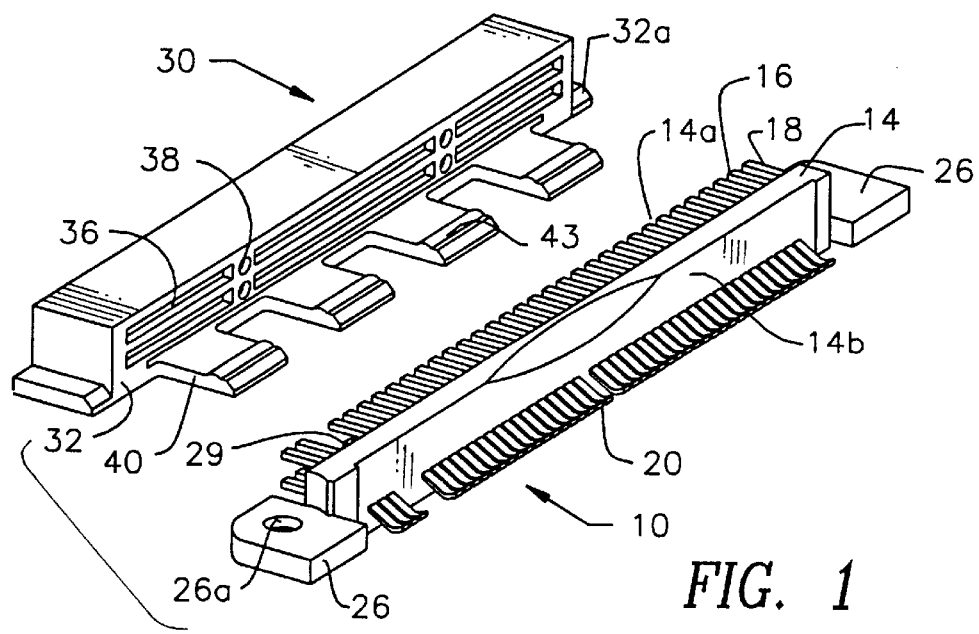
FIG. 1 is an exploded perspective view of an edge mount electrical header connector and a cover of the present invention which is used to support the header connector to a printed circuit board.
Figure 2:
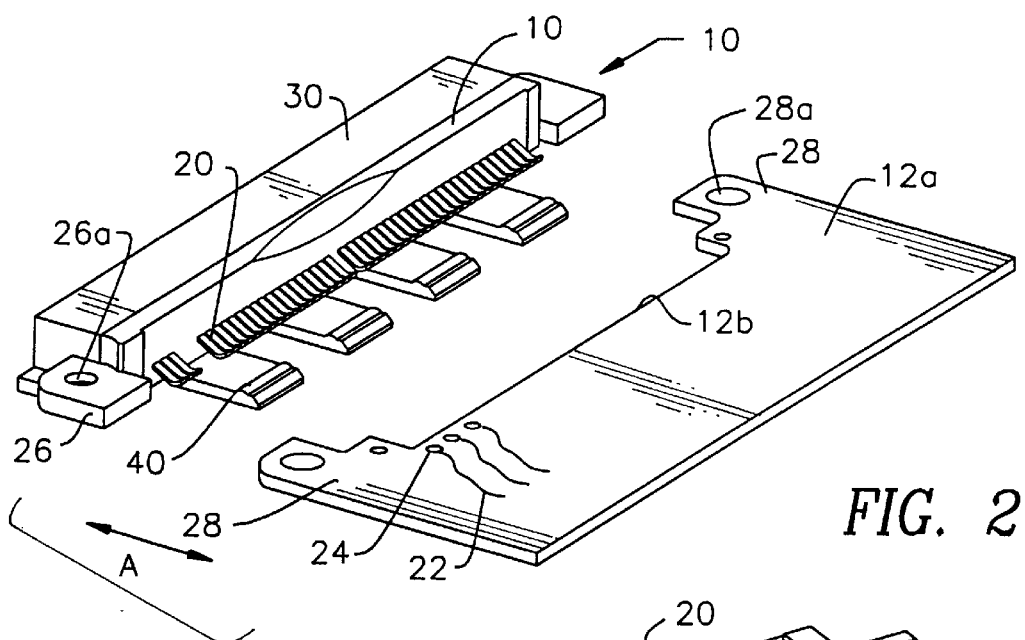
FIG. 2 is a perspective view of an assembly of the header connector and cover attachable to a printed circuit board.
Figure 3:
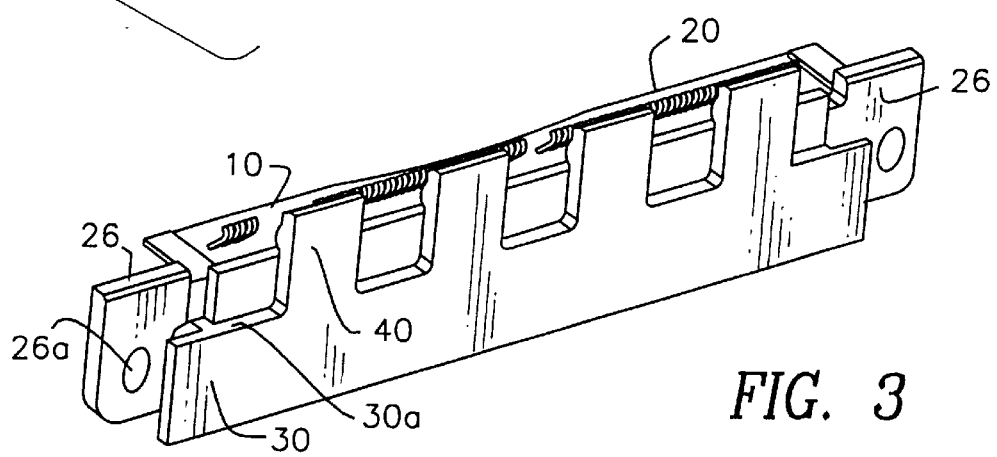
FIG. 3 is a bottom perspective view of the header connector assembled to the cover.

Referring to the drawings, the present invention permits the secure electrical interconnection of an edge mount header connector 10, shown particularly in FIG. 1, to a printed circuit board 12 shown in FIG. 2.

Edge mount header connector 10 is of generally known construction including an elongate housing 14 formed of suitably insulative material such as a glass filled polyphenylene sulphide or polyphthalamide. Housing 14 supports a plurality of electrical contacts 16 therein. Contacts 16 are also of conventional construction being formed of a suitably conductive metal. Contacts 16 include opposed ends which permit interconnection of header connecter 10. Each contact 16 includes a first end in the form of a male contact pin 18 which extends externally from one longitudinal surface 14a of housing 14 for external electrical connection with mating contacts of a mating connector as will be described in further detail hereinbelow. While a male pin is shown by way of example, any configuration of contact may be employed. Each contact 16 also includes an opposed end in the form of a solder tail 20 which extends externally from an opposite longitudinal surface 14b of housing 14. Contacts 16, including the associated pins 18 and solder tails 20, may be arranged in housing 14 in any desirable pattern. In the present embodiment, the pins 18 are arranged in two longitudinally extending rows, while the solder tails are arranged in a single longitudinally extending row.

Housing 14 is designed for mechanical and electrical connection with printed circuit board 12. Printed circuit board 12 is of conventional construction including a planar member having first surface 12a which has disposed thereon a pattern of electrically conductive traces 22 which terminate in solder pads 24. The solder pads 24 are typically aligned along a mating longitudinal edge 12b of printed circuit board 12 so that electrical connection may be established between edge mounted header connector 10 and printed circuit board 12.

As shown in FIGS. 1 and 2, the solder tails 20 of contact 16 are of the spring retention type being designed for deflectable frictional electrical engagement with the solder pads 24 of printed circuit board 12. Upon placement of the header connector 10 onto the edge 12b of printed circuit board 12, the solder tails 20 are designed and shaped to be biased against solder pads 24. The spring bias of the solder tails 20 assures that electrical connection is established between of the solder tails an the associated solder pads 24.

Once properly positioned with the solder tails 20 in contact with the solder pads 24, in conventional practice, the header connector would be mechanically mounted to the printed circuit board to fix its position with respect to the printed circuit board. In that regard, housing 14 includes a pair of extending ears 26 which extend from each longitudinal end thereof. Each ear 26 includes a mounting aperture 26a therethrough. Printed circuit board 12 includes complimentary ears 28 and associated apertures 28a therethrough. The ears 26 of housing 14 are designed for alignment with the ears 28 of printed circuit board 12 so that the apertures 26a and 28a are aligned. Conventionally, fastening hardware such as a screw and bolt (not shown) may be used to fix the header connector 10 to the printed circuit board 12 adjacent edge 12b. Positioned in this manner, the spring contact solder tails 20 are urged against the solder pads 24 effecting mechanical and electrical engagement therebetween. At this stage in the conventional assembly, the solder tails 20 of contact 16 are individually soldered to the solder pads 24 effecting permanent electrical engagement therebetween. Conventional soldering techniques such as IR, reflow or wave soldering may be employed.

While the direct mechanical mounting of header connector 10 to printed board 12 is designed to place the spring biased solder tails in secure electrical engagement with solder pads 24, certain problems which arise in manufacturing and handling may result in intermittent or ineffective contact between certain of the solder tail/ solder pad connections. During handling and manufacturing the printed circuit board and the connector may be subject to relative tilting of movement. Such movement may cause dislodgment of one or more of the solder tails from the solder pads. Further, the printed circuit board by its planar nature is subject to warpage. Board warpage makes connection to the header connector difficult. Warpage may also result in an ineffective contact between one or more of the solder tails and the solder pads. Such movement or warpage may compromise the mechanical and electrical engagement of the header connector with the printed circuit board. Furthermore, board warpage or connector tilting may also result in the loss of resiliency of the spring biased solder tails again resulting in potential intermittent contact. Any gaps or intermittent contact between the solder tails and the solder pads may result in an ineffective solder joint being achieved during the soldering process.

Figure 2A:
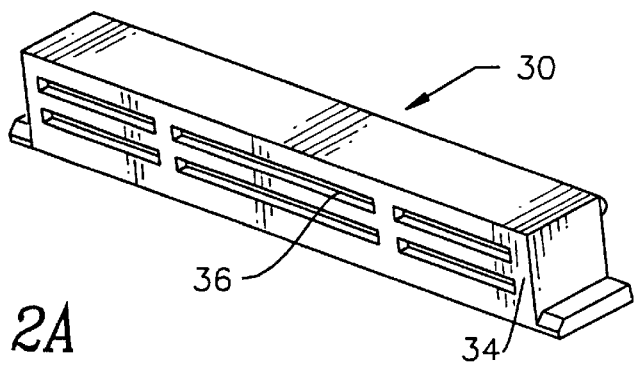
FIGS. 2A and 2B show rear and front perspective views, respectively, the cover of the present invention.
Figure 2B:
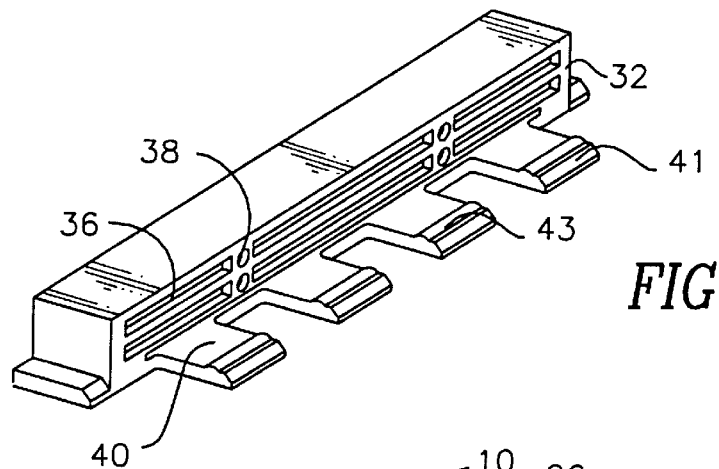

In order to more effectively attach the header connector to the printed circuit board and to assure that the solder tails of the header remain in secure electrical engagement with the solder pads of the printed circuit board during the soldering process, the present invention employs a connector cover 30 shown in detail in FIGS. 1,2A and 2B.

Cover 30 includes an elongate generally rectangular body which is formed of suitably electrically insulative material which is resistant to the effects of high temperature soldering. Cover 30 includes a first face 32 shown in detail in FIG. 2B and an opposed second face 34 shown in detail in FIG. 2A. Cover 30 includes a plurality of elongate generally rectangular openings 36 extending between first face 32 and second face 34. Openings 36 are designed for alignment with extending male pins 18 of header connector 10. Cover 30 also includes one or more generally circular apertures 38 arranged at various locations on first face 32. Apertures 38 are provided to engage in a frictional manner selected pins 18 extending from surface 14a of housing 14 to frictionally support cover 30 to header connector 10.

Cover 30 further includes a plurality of gripper arms 40 extending outwardly from a lower edge 32a of first face 32. Each gripper arm is an elongate member extending in cantilevered fashion from edge 32a of first face 32. Each gripper arm includes a beveled distal extent 41 to facilitate engagement with printed circuit board 12 as will be described hereinbelow. Proximate of distal extent 41, each gripper arm 40 includes an upwardly directed bump 43 for providing an area of concentrated engagement with printed circuit board 12 as will also be described hereinbelow. In the present embodiment, four longitudinally spaced gripper arms are shown extending from first face 32. However, fewer or more gripper arms may be employed.

Figure 5:
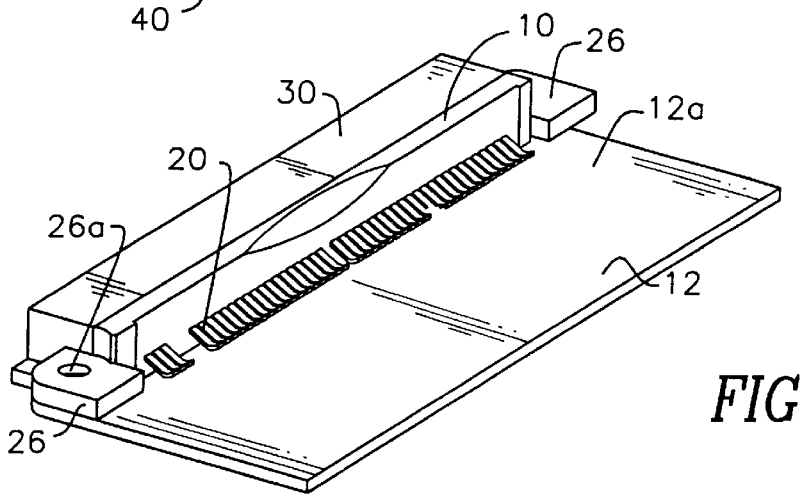
FIG. 5 is a front perspective view of the assembled header connector and cover attached to a printed circuit board.
Figure 4:
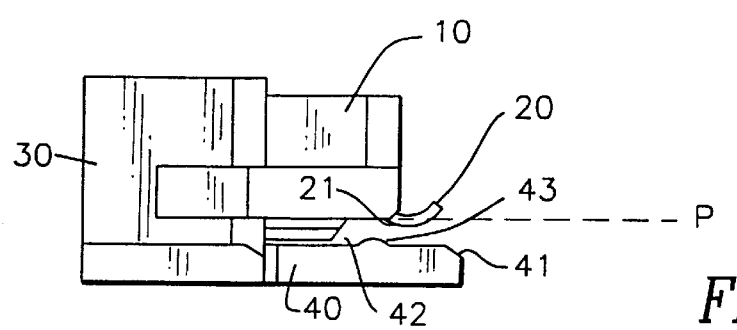
FIG. 4 is a side plan view of the header connector assembled to the cover.
Figure 6:
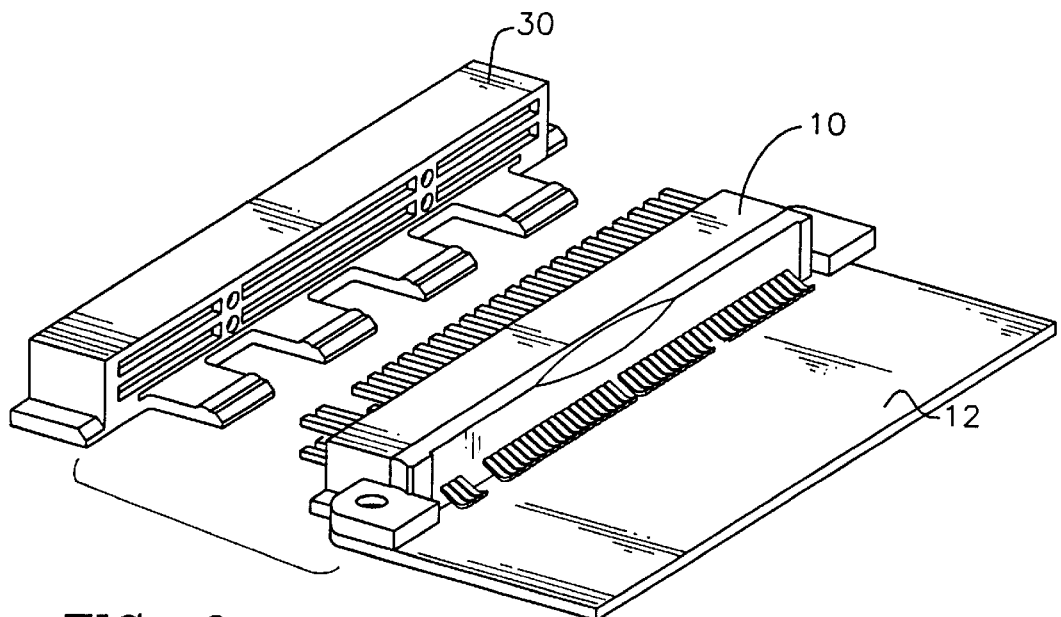
FIG. 6 shows the removal of the cover from the header connector after soldering of the header connector to the printed circuit board.
Figure 7:
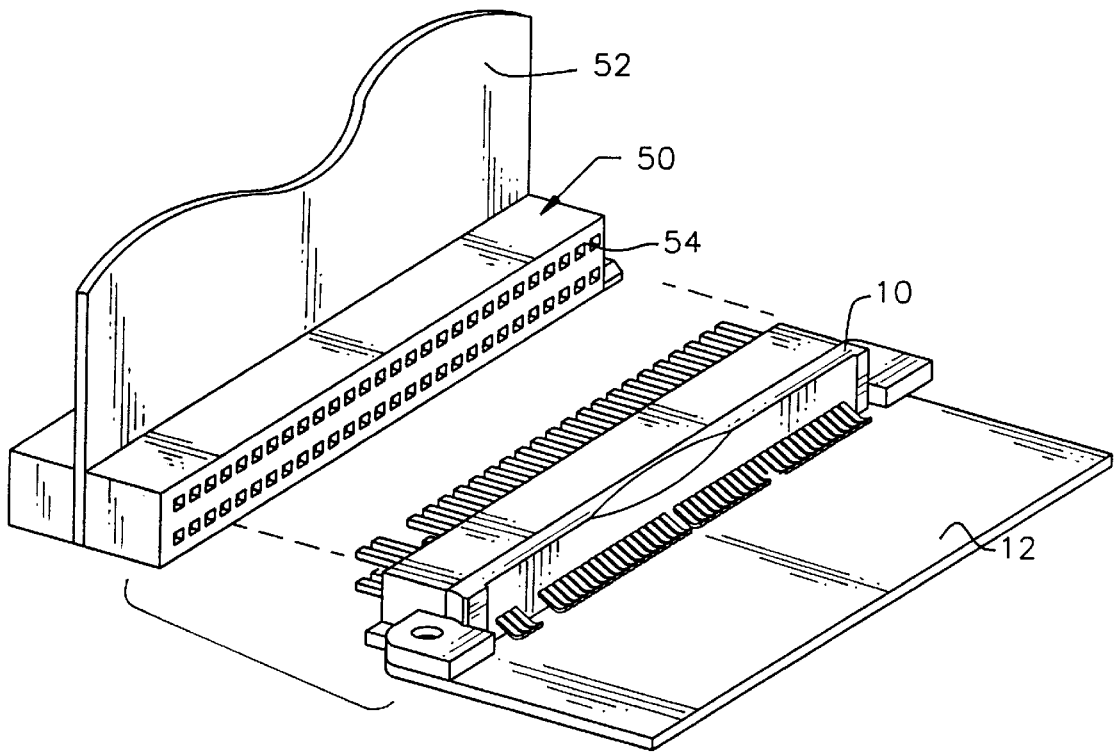
FIG. 7 shows the mating of an electrical cable connector to the header connector soldered to the printed circuit board.

With additional reference to FIGS. 4 and 5, cover 30 is designed to be secured to header connector 10 in a frictional fit manner. The cover 30 is placed over pins 18 of header connector 10. The first face 32 is positioned against surface 14a of connector 10 so that the pins 18 extend into rectangular openings 36. Frictional engagement is achieved between selected pins of connector 10 and apertures 38 on first face 32 of housing 30 to support the cover 30 on connector 10.

The positioning of gripper arms 40 of cover 30 with respect to connector 10 defines a longitudinal space 42 between gripper arms 40 and solder tails 20 of header connector 10. This space is designed for frictional receipt of the edge 12b (FIG. 2) of printed circuit board 12. In use as shown in FIG. 2, the assembled cover 30 and connector 10, are moved towards printed circuit board 12 in the direction of arrow A. The edge 12b of printed circuit board is moved into the space 42 (FIG. 4) defined between solder tails 20 and gripper arms 40. Such movement is facilitated by the beveled distal extent 41 of gripper arm 40. Movement in this manner effects mechanical engagement between header connector 10 and printed circuit 12 and electrical engagement between solder tails 20 and solder pads 24. The cover 30 of the present invention is designed in combination with header connector 10 to accommodate a specified printed circuit board thickness. Thus, the printed circuit board is frictionally fitted between gripper arm 40 and solder tail 20. Gripper arms 40 extend a sufficient length along a lower surface 12a of printed circuit board 12 to effectively support header connector 10 thereon.

The effective connection of printed circuit board 12 to header connector 10 by employing cover 30 is now shown and described.

Each solder tail 20 generally includes a curved contact surface 21 (FIG. 4) which extends below printed circuit board seating plane P within the space 42 defined between gripper arms 40 and solder tails 20. In this fashion, the curved surfaces 21 of the solder tails 20 are positively preloaded onto the solder pads 24 (FIG. 2) of printed circuit board 12 providing superior electrical engagement therewith. The curved surfaces 21 of solder tails 20 are positioned in spaced facing opposition to the bumps 43 of gripper arm 40. The space defined between bumps 43 and curved surfaces 21 is less than the thickness of the printed circuit board to assure contact pre-loading. Use of spring biased solder tails allows control of the coplanarity of the solder tails to be relaxed without sacrificing the ability to make good electrical contact with the solder pads of the printed circuit board. As mentioned above, it is common that printed circuit boards exhibit warpage due to shrinkage or other post-manufacturing conditions. Due to this warpage, it may become difficult to maintain good electrical contact between all of the solder pads of the printed circuit board and each of the individual solder tails of the connector. In the present invention, by employing cover 30 having a plurality of gripper arms 40 which works in conjunction with header connector 10, the problems of board warpage as well as other problems of movement of the connector with respect to the board prior to soldering can be effectively overcome.

Having described the components of the embodiment of FIGS. 1–7 of the present invention, its use may be further described.

Referring to FIG. 1, cover 30 is attached to header connector 10 with the first face 32 of cover 30 being positioned against surface 14a of housing 14. Frictional engagement secures cover 30 to connector 10 by the frictional interfitting of selected pins 18 of header connector 10 with apertures 38 of cover 30. The assembled cover and header combination as shown in FIG. 2 may be brought into engagement with printed circuit board 12 by movement of printed circuit 12 towards the connector/cover combination in the direction of arrow A. Upon insertion of board 12 into space 42 along seating plane P as shown in FIG. 4, spring biased electrical engagement is established between curved surfaces 21 of solder tails 20 and solder pads 24 of board 12 (FIG. 2). The relative dimensions of the printed circuit board 12 and the space between the solder tails 20 and gripper arms 40 results in spring defection of the solder tails 20 so as to achieve resilient engagement between the curved surfaces 21 of the solder tails 20 and the solder pads 24 of printed circuit board 12. The gripper arms 40 maintain the solder pads 24 in engagement with the spring biased solder tails 20 correcting for any board warpage and also preventing disconnection of any of the individual solder tails from the solder pads during movement of the components during further manufacturing procedures.

In the position shown in FIG. 5, the solder tails of header connector 10 may be soldered to the solder pads in a conventional fashion. It is noted that during the soldering process, the cover 30 is used to secure header connector 10 to the printed circuit board 12. At this stage, no external securement hardware is necessary. Such securement hardware may render certain soldering techniques more difficult to practice. Once the solder tails 20 are effectively soldered to solder pads 24, cover 30 may be removed from the connector/board assembly in a manner shown in FIG. 6. The cover 30 is then discarded. Permanent attachment of header connector 10 to printed circuit board 12 may now be made by use of appropriate securement hardware (not shown). Such securement hardware may be positioned through apertures 26a, 28a of ears 26,28 of the header connector 10 and board 12 respectively.

The header connector 10 mounted to printed circuit board 12 is now available for mating electrical connection. While any type of mating connector may be mated to header 10, the present invention in the preferred embodiment shows a ribbon connector 50 terminating a multiconductor ribbon cable 52. The male pins 18 of header connector 10 are accessible for interconnection with appropriately constructed socket contacts 54 of ribbon connector 50.

A further embodiment of the present invention is shown with respect to FIGS. 8–14.

Figure 8:
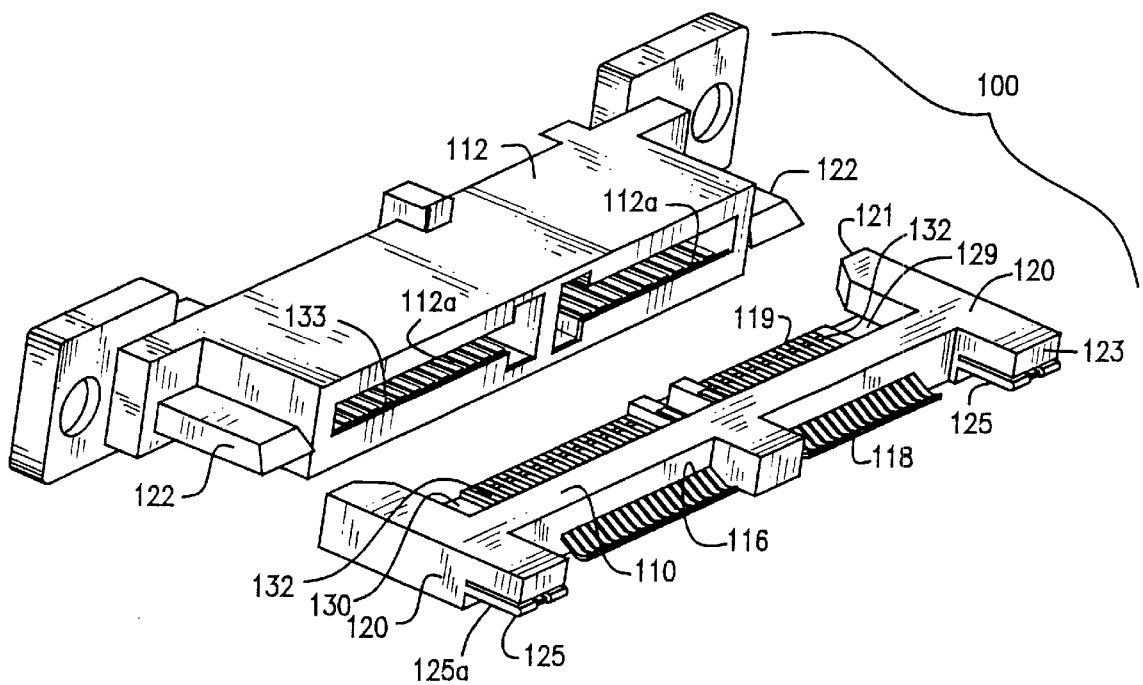
FIG. 8 is a perspective showing of a further embodiment of a device bay electrical plug connector attachable to a mating device bay electrical receptacle connector.

Referring specifically to FIG. 8, the present invention may be employed in combination with a connection assembly referred to as a device bay connection assembly 100. Device bay connection assembly 100 includes a device bay plug 110 which is interconnectible to a device bay receptacle 112. The device bay plug 110 includes an elongate insulative housing 114 (FIG. 10) and supports therealong a plurality of electrical contacts 116. Contacts 116 have extending solder tails 118 which are designed for solder connection to the edge of a printed circuit board in a manner set forth above with respect to the connector embodiment shown in FIGS. 1–7.

Housing 114 further includes a pair of end structures 120 forming the longitudinal ends of housing 114. End structures 120 have a forward end 121 including an opening 121a (FIG. 14) designed for accommodating a projection 122 adjacent either longitudinal end of receptacle 112 so as to establish aligned interconnection of plug 110 with receptacle 112. Opposed ends 123 of each end structure 120 includes a hold-down foot 125 for engagement with the printed circuit board in a manner which will be described in further detail hereinbelow.

Figure 11:
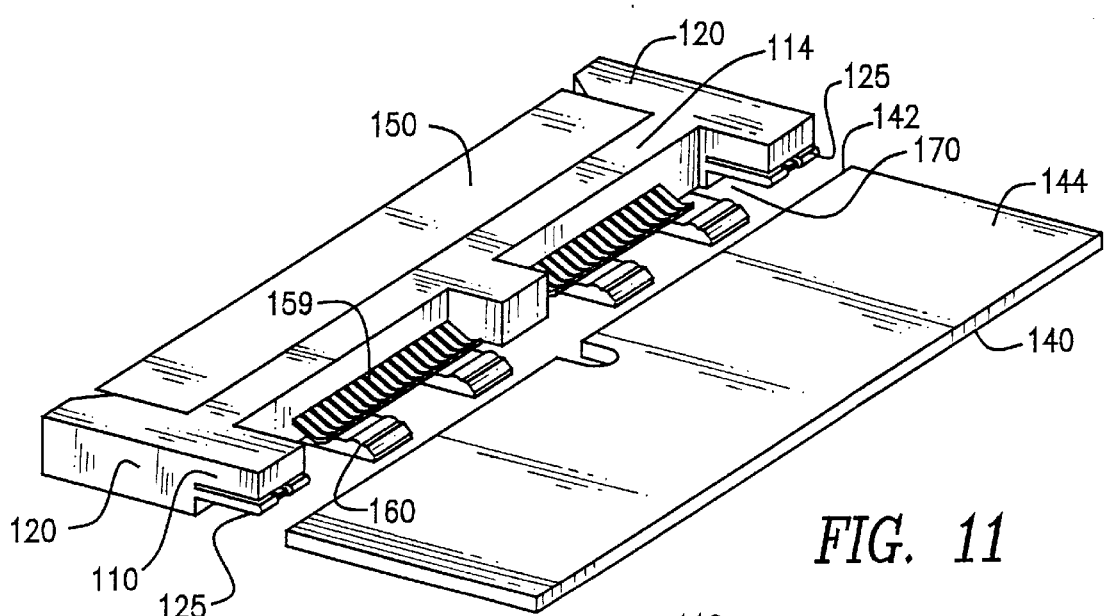
FIG. 11 shows the cover and connector assembly of FIG. 10 positioned for accommodating the edge of a printed circuit board.
Figure 12:
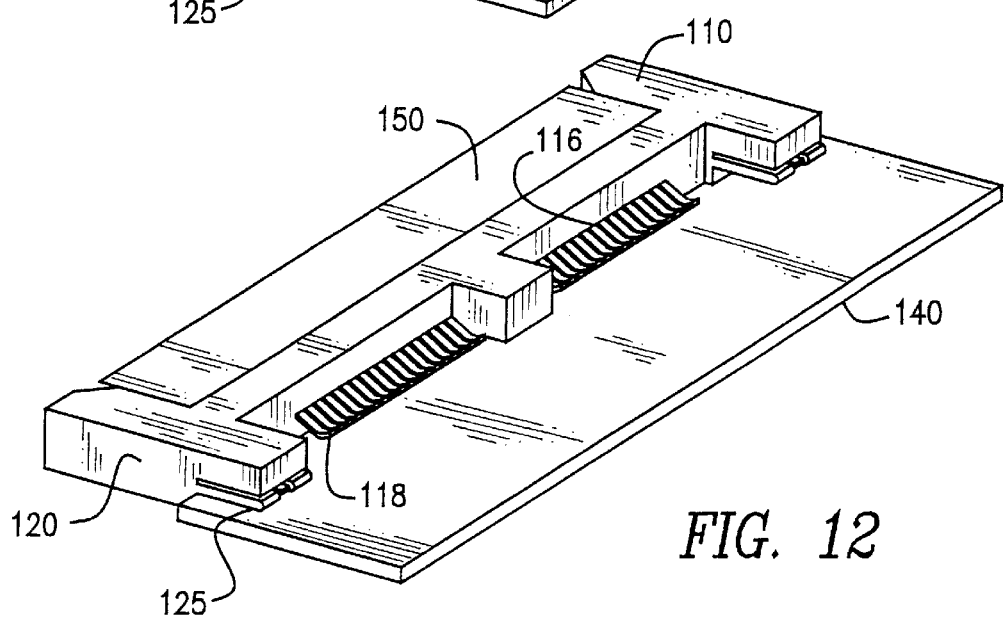
FIG. 12 shows the cover and connector assembly of FIG. 11 attached to the printed circuit board.
Figure 13:
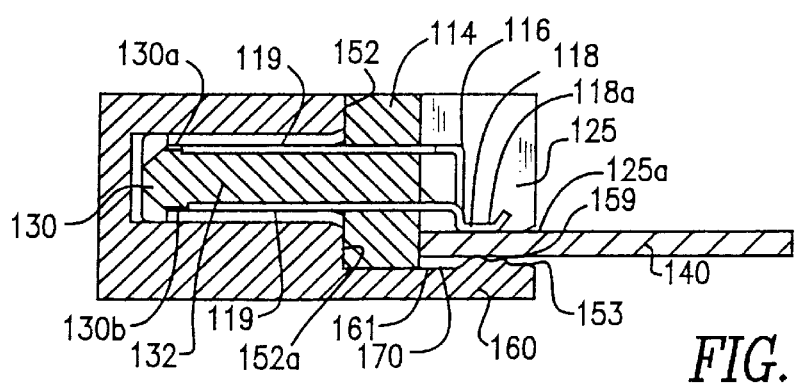
FIG. 13 is a vertical cross-sectional showing of the cover and connector assembly of FIG. 12.

With additional reference to FIGS. 9–13, housing 114 includes a first interconnection face 129 having a pair of longitudinally spaced platforms 130 extending therefrom. Each platform 130 has opposed planar surfaces 130a and 130b (FIG. 13). Contacts 116 of plug 110 include extending connection extents 119 which are longitudinally spaced along the opposed surfaces 130a and 130b of platforms 130. The longitudinally spaced platforms 130 including connection extents 119 positioned therealong, define a pair of longitudinally spaced interconnection engagement arrays 132. As shown in FIG. 8, each engagement array 132 is designed for insertion into an opening 112a in device bay receptacle 112 placing connection extents 119 in electrical engagement with electrical contact surfaces 133 of receptacle 112. In this manner, mechanical and electrical interconnection may be established between device bay plug 110 and device bay receptacle 112.

Device bay plug 110 is designed to be connected to a printed circuit board 140 along an edge 142 thereof so as to establish electrical connection between solder tails 118 and conductive traces or pads (not shown) on an upper surface 144 of printed circuit board 140. In order to provide for the mechanical and electrical connection of plug 110 to printed circuit board 140, plug 110 is used in combination with a removable cover 150.

Figure 9:
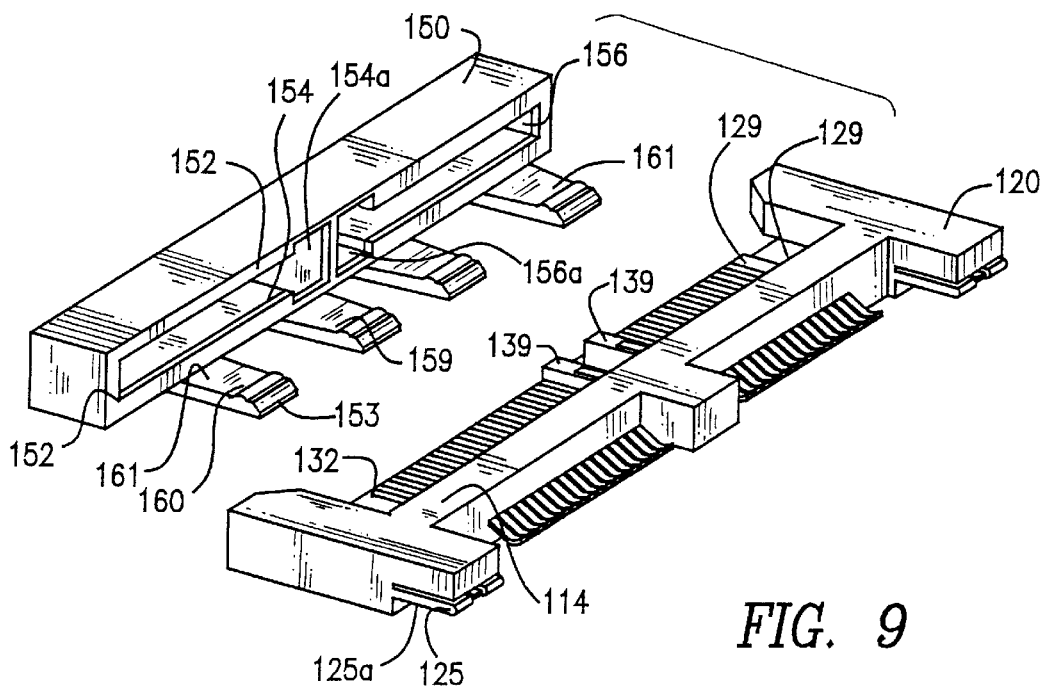
FIG. 9 is an exploded perspective view of the electrical plug connector and a further embodiment of a cover used to enclose portions of the plug connector.

Cover 150, more fully shown in FIG. 9, is substantially similar to cover 30 described above with respect to the embodiments shown in FIGS. 1–7. Cover 150 is an elongate, rectangular member formed of suitably electrically insulative material which is resistant to the effects of high temperature soldering. Cover 150 includes a first face 152 including a pair of longitudinally spaced cavities 154 and 156. Cavities 154 and 156 are constructed to accommodate therein the pair of spaced apart engagement arrays 132 of plug 110. Furthermore the specific configuration of cavities 154 and 156 are designed such that it provides keyed accommodation of each engagement array 132 of plug 110. Each cavity 154 and 156 includes an enlarged rectangular portion 154a, 156a in juxtaposition adjacent the center of cover 150. Such rectangular portions 154a, 156a are designed to accommodate therein lateral projections 139 adjacent the end of each engagement array 132. Such keyed interfitting between the rectangular portion of the cavities and the projections 139 of array 132 provides for proper orientation and alignment of the plug 110 with respect to cover 150. Such engagement also provides for the removable frictional securement of cover 150 to plug 110.

As described above, cover 150 also includes a plurality of gripper arms 160 extending outwardly from a lower edge 152a of first face 152. Each gripper arm 160 is an elongate member extending in a cantilevered fashion from edge 152a and includes a beveled distal extent 153 to facilitate engagement with printed circuit board 140 as will be described hereinbelow. Each gripper arm 160 also includes an upwardly directed bump 159 for providing an area of concentrated engagement with printed circuit board 12.

Figure 10:
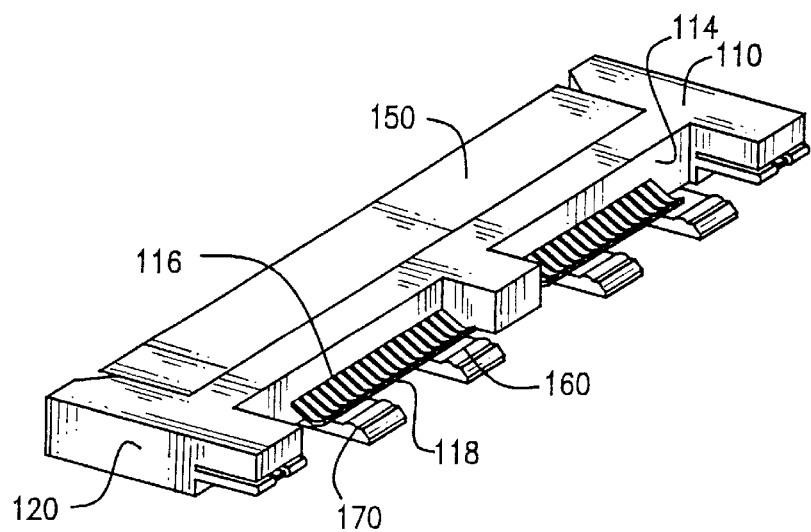
FIG. 10 shows the cover and connector assembly of FIG. 9 in attached condition.

Cover 150 is assembled to plug 110 as shown in FIG. 10. The cover 150 is retained on plug 110 by removable frictional engagement. As shown in FIGS. 10 and 13, the assembly of the cover 150 and plug 110 define a printed circuit board receiving space 170 between hold-down feet 125 and gripper arms 160.

As shown in FIG. 11, the assembly of the cover 150 and plug 110 may be brought towards the edge 142 of printed circuit board 140.

In a manner similar to that described above, solder tails 118 include a curved contact surface 118a (FIG. 13) which would extend into printed circuit board receiving space 170 defined between hold-down feet 125 and gripper arms 160. This provides a preload of the solder tails 118 against the upper surface 144 of printed circuit board 140. Each of the hold-down feet 125 defines a gripping surface 125a which is in spaced opposition to a gripper arm surface 161 of gripping arms 160. The space 170 so defined assures that the contact tails will be preloaded against the upper surface 144 of printed circuit board 140. This facilitates the accurate soldering of solder tails 118 to the solder pads of printed circuit board 140.

With respect to the device bay plug 110 shown FIGS. 8–14, hold-down feet 125 are particularly significant as the contact solder tails 118 are smaller and arranged at a finer pitch than the connector described above with respect to FIGS. 1–7. Thus, the hold-down feet 125 provide stronger surface contact with the printed circuit board assuring that the printed circuit board is maintained in a planar fashion without warpage. Use of hold-down feet 125 in combination with the gripper arms 160 assures that no undue stress will be placed on the fragile solder tails prior to and during the soldering process.

Having described the components of the embodiment of FIGS. 8–14 of the present invention, its use may be further described.

Figure 14:
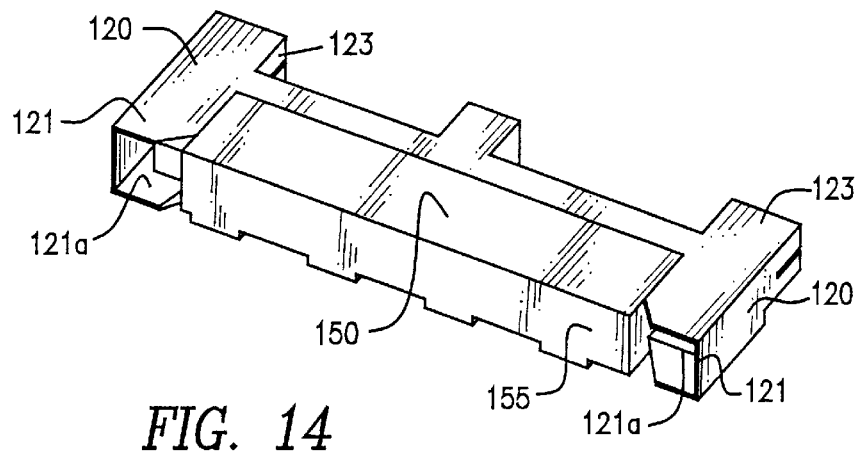
FIG. 14 is a front perspective showing of the cover and connector assembly of FIG. 10.

Cover 150 is attached to plug connector 110 with the first face 152 of cover 150 being inserted over arrays 132 of plug 110. Each array 132 is contained within the enclosed cavities 154 and 156 of cover 150 where it is protected from contact with dust, solder paste and other foreign matter during the soldering process. As shown in FIG. 14, the opposed second face 155 of cover 150 is closed preventing such foreign matter from entering thereinto.

Assembled cover and plug as shown in FIG. 12 may be brought into engagement with printed circuit board 140. The printed circuit board 140 is held in the space 170 defined between hold-down feet 125 of plug 110 and gripper arms 160 of cover 150. In this position the solder tails 118 of contacts 116 are placed in a preloaded condition against the upper surface 144 of printed circuit board 140 along edge 142. The solder tails may then be soldered to the conductive solder pads (not shown) on printed circuit board 140. During such soldering the engagement arrays 132 of plug 110, that is the platforms 130 and the contact extents 119 thereon, are completely contained within the enclosed cavities 154 and 156 of cover 150 and are not exposed to the adverse effects of the soldering operation.

Once the tails 118 are soldered to printed circuit board 140, the cover 150 may be removed and discarded. By removing the cover 150 the engagement arrays 132 are exposed so that device bay plug 110 may be interconnected to device bay receptacle 112 as shown in FIG. 8.

Various changes and modifications can be made to the invention, and it is intended to include all such changes and modifications as come within the scope of the invention as is set forth in the following claims.

What is claimed is:

1. A kit of parts adapted to establish mechanical and electrical connection between a printed circuit board having plural solder pads along an edge thereof and a receptacle connector, said kit comprising:

a plug connector having an elongate insulative housing and plural electrical contacts supported therein, said contacts having solder tails extending from said housing and adapted to be supported at said edge of said printed circuit board for solder connection to said solder pads, said contacts further including plural connection extents being supported on an opposed planar surface of plural extending housing platforms, said connection extents and said platforms forming plural spaced apart interconnection engagement arrays adapted for electrical connection to said receptacle connector; and a cover adapted for removable attachment to said plug connector, said cover including an elongate insulative body having plural spaced apart enclosed cavities, each said engagement array adapted to be accommodated in one of said cavities for individually enclosing each said engagement array including said connection extents and said platforms.

2. A kit of parts of claim 1 wherein said plug connector housing includes, at each longitudinal end thereof, a hold-down foot, each said hold-down foot defining a gripping surface and wherein said cover includes plural gripper arms extending therefrom, each said gripper arm having a gripper arm surface in facing spaced opposition to said gripping surfaces of said hold-down feet so as to define a space therebetween for supporting said edge of said printed circuit board.

3. A kit of parts of claim 2 wherein said solder tails extend within said space formed between said gripping surfaces of said hold-down feet and said gripper arm surfaces of said gripper arms for exerting a preload pressure on said solder pads of said printed circuit board.

4. A kit of parts of claim 3 wherein said cover and said plug connector include cooperating keying structure adapted for keyed accommodation of said plug connector with said cover.

5. A kit of parts of claim 4 wherein said keying structure of said cover includes said cavities and said keying structure of said plug connector includes said housing platforms.

* * * * *